United States Patent
Chopra et al.

(10) Patent No.: US 10,577,515 B1
(45) Date of Patent: Mar. 3, 2020

(54) DIELECTRIC INK COMPOSITION

(71) Applicant: XEROX CORPORATION, Norwalk, CT (US)

(72) Inventors: Naveen Chopra, Oakville (CA); Sarah J. Vella, Milton (CA); Biby Esther Abraham, Toronto (CA); Cuong Vong, Hamilton (CA)

(73) Assignee: XEROX CORPORATION, Norwalk, CT (US)

( * ) Notice: Subject to any disclaimer, the term of this patent is extended or adjusted under 35 U.S.C. 154(b) by 0 days.

(21) Appl. No.: 16/200,394

(22) Filed: Nov. 26, 2018

Related U.S. Application Data

(60) Provisional application No. 62/740,272, filed on Oct. 2, 2018.

(51) Int. Cl.
| | |
|---|---|
| *C08F 2/46* | (2006.01) |
| *C08F 2/50* | (2006.01) |
| *C08G 61/04* | (2006.01) |
| *C09D 11/38* | (2014.01) |
| *C09D 11/101* | (2014.01) |
| *B41M 5/00* | (2006.01) |
| *H05K 1/02* | (2006.01) |
| *C09D 11/107* | (2014.01) |

(52) U.S. Cl.
CPC ............ *C09D 11/38* (2013.01); *B41M 5/0023* (2013.01); *C09D 11/101* (2013.01); *C09D 11/107* (2013.01); *H05K 1/02* (2013.01); *H05K 2201/0145* (2013.01)

(58) Field of Classification Search
CPC .............. C08F 2/46; C08F 2/50; C08G 61/04
USPC ...... 522/18, 12, 7, 6, 71, 189, 184, 1; 520/1
See application file for complete search history.

(56) References Cited

U.S. PATENT DOCUMENTS

| | | | |
|---|---|---|---|
| 8,702,221 B2 | 4/2014 | Chopra et al. | |
| 2014/0017460 A1 | 1/2014 | Xu et al. | |
| 2014/0224531 A1* | 8/2014 | Chopra ............... | H01B 3/447 174/258 |
| 2017/0183536 A1 | 6/2017 | Song et al. | |
| 2017/0355871 A1 | 12/2017 | Song et al. | |
| 2018/0037745 A1 | 2/2018 | Song et al. | |
| 2018/0079926 A1 | 3/2018 | Song et al. | |
| 2018/0100073 A1 | 4/2018 | Chopra et al. | |
| 2018/0100074 A1 | 4/2018 | Chopra et al. | |
| 2018/0100075 A1 | 4/2018 | Chopra et al. | |

OTHER PUBLICATIONS

Balta et al, Thioxanthone-Anthracene: A New Photoinitator for Free Radical Polymerization in the Presence of Oxygen, 2007, Macromolecules, 40, 4138-4141 (Year: 2007).*
Author unknown, "Isopropylthioxanthone (ITX)," Other Fine Chemicals—ITX product description, downloaded on Sep. 27, 2018, 2 pages.
Author unknown, "Photoinitiators for UV Curing," Ciba Specialty Chemicals, Key Products Selection Guide 2003, 8 pages.
Schwalm, "UV Coatings, Basic, Recent Developments and New Applications," Elsevier Science, Dec. 21, 2006, 316 pages.
Green, "Industrial Photoinitiators," a Technical Guide, 2010, CRC Press, Taylor & Francis Group, 298 pages.

* cited by examiner

*Primary Examiner* — Jessica Whiteley
(74) *Attorney, Agent, or Firm* — MH2 Technology Law Group LLP

(57) ABSTRACT

A dielectric ink composition includes at least one (meth)acrylate compound selected from the group consisting of (meth)acrylate monomers, (meth)acrylate oligomers and combinations thereof; a sensitizing photoinitiator; an amine synergist photoinitiator; and a phosphine oxide photoinitiator. A device including a dielectric layer formed by printing the dielectric ink composition described herein is also disclosed.

20 Claims, 9 Drawing Sheets

DIELECTRIC INK COMPOSITION

RELATED APPLICATIONS

This application claims the benefit of U.S. Provisional Application No. 62/740,272, filed Oct. 2, 2018, the disclosure of which is incorporated herein by reference in its entirety.

DETAILED DESCRIPTION

Field of the Disclosure

The present disclosure is directed to a dielectric ink composition and a device formed using the dielectric ink composition.

Background

Printed electronics technology is an approach for the manufacturing of electronic devices using conductive inks. Complex printed electronic device architectures, such as antennae, chip interconnects and other device elements, often include insulating dielectric layers to enable 'crossovers' where two printed wires cross without making electrical contact with one another.

UV-curable compositions are an attractive option for printable dielectric materials due to possible advantages, such as 100% solids, fast cure, and customizable properties of the final polymer. One challenge to overcome when employing these UV-curable compositions is surface cure inhibition, which arises due to reaction of the monomer radicals with oxygen to create 'dead' hydroperoxy groups (R—O—O—H), thereby effectively consuming the photoinitiator at the surface, as shown in FIG. 1. The result is a sticky, uncured surface, which can have a detrimental effect on conductive ink lines printed on the dielectric surface.

A printable UV-curable dielectric material with adequate surface cure and that is capable of supporting the printing of conductive ink features on the surface with good conductivity would be a welcome addition in the art.

SUMMARY

An embodiment of the present disclosure is directed to a dielectric ink composition. The dielectric ink composition comprises: at least one (meth)acrylate compound selected from the group consisting of (meth)acrylate monomers, (meth)acrylate oligomers and combinations thereof; a sensitizing photoinitiator; an amine synergist photoinitiator; and a phosphine oxide photoinitiator.

An embodiment of the present disclosure is directed to a device. The device comprises: a substrate; a first conductive line disposed over the substrate; and a second conductive line disposed over the first conductive line at a junction. A dielectric layer is disposed at the junction between the first conductive line and the second conductive line so as to electrically insulate the first conductive line from the second conductive line. The dielectric layer is formed by printing a dielectric ink composition, the dielectric ink composition comprising: at least one (meth)acrylate compound selected from the group consisting of (meth)acrylate monomers, (meth)acrylate oligomers and combinations thereof; a sensitizing photoinitiator; an amine synergist photoinitiator; and a phosphine oxide photoinitiator.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

Figure 1:
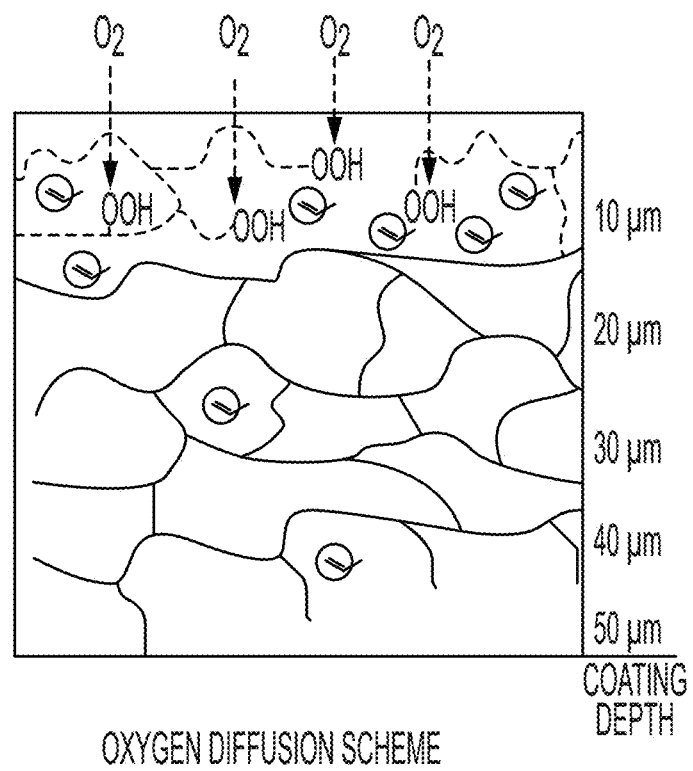
FIG. 1 shows a dielectric composition with a surface that is only partially cured by UV radiation due to a known problem of surface cure inhibition.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

Ink Compositions

An embodiment of the present disclosure is directed to a dielectric ink composition. The ink composition includes at least one (meth)acrylate compound selected from the group consisting of (meth)acrylate monomers, (meth)acrylate oligomers and combinations thereof; a sensitizing photoinitiator; an amine synergist photoinitiator; and a phosphine oxide photoinitiator.

Acrylate Monomer and Oligomers

The curable dielectric ink composition contains at least one (meth)acrylate compound selected from the group consisting of (meth)acrylate monomers, (meth)acrylate oligomers and combinations thereof. The monomers include chemically reactive functionalities capable of undergoing free radical polymerization reactions with other monomers and/or the oligomers. A single species of monomer may be used or combinations of different species of monomers. Suitable, illustrative monomers include mono- and multifunctional (e.g., di-, tri-, etc.) (meth)acrylates. The term "(meth)acrylate" or "(meth)acrylates" as used herein encompasses methacrylates alone, acrylates alone or a combination of methacrylates and acrylates.

Suitable, illustrative monofunctional (meth)acrylates include 2-phenoxyethylacrylate, alkoxylated lauryl acrylate, alkoxylated phenol acrylate, alkoxylated tetrahydrofurfuryl acrylate, caprolactone acrylate, cyclic trimethylolpropane formyl acrylate, ethylene glycol methyl ether methacrylate, ethoxylated nonyl phenol acrylate, isobornyl acrylate (e.g., SR506 from Sartomer Chemical Corp.), isobornyl methacrylate (e.g., SR 423 from Sartomer Chemical Corp.), isodecyl acrylate, isooctyl acrylate, lauryl acrylate, octadecyl acrylate (stearyl acrylate), tetrahydrofurfuryl acrylate (e.g., SR285 from Sartomer Chemical Co.), tridecyl acrylate, and 4-acryolyl morpholine (from Aldrich Chemical Co.). Monofunctional urethane (meth)acrylates such as 2-[[(butylamino)carbonyl]oxy]ethyl acrylate, available from IGM Resins under the product name Photomer 4184 may also be used.

Suitable, illustrative difunctional (meth)acrylates include 1,12 dodecane diol diacrylate, 1,3-butylene glycol diacrylate, 1,4-butanediol diacrylate, 1,6-hexanediol diacrylate (e.g., SR238B from Sartomer Chemical Co.), alkoxylated hexanediol diacrylate, alkoxylated neopentyl glycol diacrylate, cyclohexane dimethanol diacrylate, diethylene glycol diacrylate (e.g., SR230 from Sartomer Chemical Co.), ethoxylated (4) bisphenol A diacrylate (e.g., SR601 from Sartomer Chemical Co.), neopentyl glycol diacrylate, polyethylene glycol (400) diacrylate (e.g., SR344 from Sartomer Chemical Co.), propoxylated (2) neopentyl glycol diacrylate (e.g., SR9003B from Sartomer Chemical Co.), tetraethylene glycol diacrylate (e.g., SR268 from Sartomer Chemical Co.), tricyclodecane dimethanol diacrylate (e.g., SR833S from Sartomer Chemical Co.), triethylene glycol diacrylate (e.g., SR272 from Sartomer Chemical Co.), and tripropylene glycol diacrylate.

Suitable, illustrative trifunctional (meth)acrylates include ethoxylated (9) trimethylol propane triacrylate, pentaerythritol triacrylate, propoxylated (3) glyceryl triacrylate (e.g., SR9020 from Sartomer Chemical Co.), propoxylated (3) trimethylol propane triacrylate (e.g., SR492 from Sartomer Chemical Co.), and tris (2-hydroxylethyl) isocyanurate triacrylate (also referred to herein as tris (2-hydroxy ethyl acrylate) isocyanurate, available commercially as, e.g., SR368 from Sartomer Chemical Co.).

Other suitable multifunctional (meth)acrylates include di-trimethylolpropane tetraacrylate, dipentaerythritol pentaacrylate (e.g., SR399 from Sartomer Chemical Co.), and ethoxylated (4) pentaerythritol tetraacrylate (e.g., SR494 from Sartomer Chemical Co.).

In embodiments, the monomers include one or more, such as all three, of monofunctional (meth)acrylates, di(meth)acrylates, and tri(meth)acrylates, where di(meth)acrylates and tri(meth)acrylates are respectively referred to herein as difunctional (meth)acrylates and trifunctional (meth)acrylates. Thus, in an embodiment, the monomers can include at least one monofunctional (meth)acrylate, at least one difunctional (meth)acrylate and at least one trifunctional (meth)acrylate. In an embodiment, the compositions of the present disclosure include 2, 3, 4 or more different (meth)acrylates monomers.

In embodiments, the monomers include a tri(meth)acrylate that act as a cross-linker (e.g., a trifunctional (meth)acrylate crosslinker), such as tris (2-hydroxy ethyl acrylate) isocyanurate. The amount of trifunctional (meth)acrylate crosslinker can be any suitable amount, such as, for example, from about 2 wt. % to about 25 wt. %, such as about 5 wt. % to about 20 wt. %, or about 5 wt. % to about 15 wt. %, based on the total weight of the wet dielectric ink composition. Unless otherwise stated, all weight percentages given herein for ingredients of the dielectric ink composition are based on the total amount of wet dielectric ink composition (e.g., the composition that is ready for printing).

In embodiments, the monomers do not include tricyclodecane dimethanol diacrylate. In embodiments, the monomers do not include an non-oligomeric urethane (meth) acrylate, a urea (meth)acrylate, an isocyanurate (meth) acrylate, or all three. In embodiments, the monomers do not include tris(2-hydroxy ethyl) isocyanurate triacrylate. In embodiments, the monomers do not include a monofunctional urethane (meth)acrylate. In embodiments, the monomers do not include 2-[[(butylamino)carbonyl]oxy]ethyl acrylate.

Monomers utilized in the curable dielectric ink composition which are liquids at room temperature may be each characterized by a dynamic viscosity, as measured using a commercially available rheometer such as the Ares G2 from TA instruments. In embodiments, the monomer has a dynamic viscosity of less than about 50 cP at about 25° C. This includes embodiments in which the monomer has a dynamic viscosity of less than about 40 cP at about 25° C. or less than about 30 cP at about 25° C. In embodiments, the monomer has a dynamic viscosity in the range of from about 5 cP to about 50 cP at about 25° C. This includes embodiments in which the viscosity is in the range of from about 5 cP to about 30 cP at about 25° C. or from about 5 cP to about 25 cP at about 5° C. If more than one type of monomer is present in the curable dielectric ink compositions, these viscosity values may refer the viscosity value of each individual monomer present in the curable dielectric ink compositions.

Monomers utilized in the curable dielectric ink composition which are solids at room temperature may be each characterized by a melting temperature. In embodiments, the monomer has a melting temperature in the range of from about 30° C. to about 100° C. This includes embodiments in which the melting temperature is in the range of from about 30° C. to about 70° C., or from about from about 40° C. to about 60° C.

Monomers utilized in the curable dielectric ink composition may be characterized by a high glass transition temperature (Tg). For example, one or more of the monomers can have glass transition temperatures ranging from about 20° C. to about 300° C., such as about 35° C. to about 275° C., or about 60° C. to about 200° C., or about 80° C. to about 200° C. An example of a monomer with a relatively high glass transition temperature is isobornyl acrylate, which has a glass transition temperature of about 100° C. Multifunctional (meth)acrylates can have glass transition temperatures exceeding 100° C., owing to the high degree of crosslinking. An example of a multifunctional monomer with a relatively high glass transition temperature is tris-(2-hydroxyethyl acrylate) isocyanurate, with a glass transition temperature of 272° C. Other example glass transition temperatures include for various monomers/oligomers include: SR272 (triEGDA), a Tg of 47° C.; S268 (tetraEGDA), a Tg of 23° C.; and BR741D, a Tg of 79° C. Employing one or more monomers with relatively high glass transition temperatures can improve the toughness of any parts made from the dielectric material. This can be useful in various processes, such as where the dielectric is employed in a 3D printed part.

The monomers may be included in the present curable dielectric ink compositions in various suitable amounts. In embodiments, the monomer is present in the curable dielectric ink composition in an amount ranging from about 1 weight % to about 50 weight %, based on the total weight of the curable dielectric ink composition. This includes embodiments in which the monomer is present in an amount ranging from about 1 weight % to about 10 weight %, from about 4 weight % to about 8 weight %, from about 8 weight % to about 20 weight %, from about 20 weight % to about 45 weight %, or from about 25 weight % to about 40 weight %, based on the total weight of the curable dielectric ink composition. In embodiments in which more than one species of monomer is present in the curable dielectric ink composition, these amounts may refer to the amount of each individual monomer present in the curable dielectric ink composition.

In embodiments, the total amount of monomer present in the curable dielectric ink composition is not more than 90 weight %, based on the total weight of the curable dielectric ink composition. This includes embodiments in which the total amount is in the range of from about 35 weight % to about 80 weight %, from about 50 weight % to about 75 weight %, or from about 55 weight % to about 75 weight %, based on the total weight of the curable dielectric ink composition.

In embodiments, the curable dielectric ink composition includes at least two species of monomer having different viscosity values. The present curable dielectric ink compositions may be characterized by relatively high ratios of the lowest viscosity mono-functional or di-functional monomer to the weight % of the highest viscosity mono-functional or di-functional monomer (as determined by the (weight % of the lowest viscosity mono-functional or di-functional monomer)/(weight % of the highest viscosity mono-functional or di-functional monomer)), where the viscosity values are determined at room temperature (e.g., 25° C.). In embodiments, this ratio is at least about 2. This includes embodiments in which the ratio is at least about 3, at least about 4, or at least about 5. In embodiments, this ratio is in the range of from about 2 to about 10. This includes embodiments in which the ratio is in the range of from about 3 to about 9, or about 4 to about 9, or from about 5 to about 8. As an example calculation, the mono- and di-functional monomers in the formulations of Table 1 of the present application include isobornyl acrylate (viscosity of about 8 cps); triethylene glycol diacrylate (viscosity of about 15 cps) and tetraethylene glycol diacrylate (viscosity of about 20 cps). Thus, for the formulation of Example 4 of Table 1, the weight ratio of the lowest viscosity mono-functional or di-functional monomer to the weight % of the highest viscosity mono-functional or di-functional monomer would be the weight % of isobornyl acrylate (37.6 wt. %) divided by the weight % of tetraethylene glycol diacrylate (6.8 wt. %), which is a ratio of about 5.5.

In an embodiment, the curable dielectric ink composition contains at least one (meth)acrylate oligomer. A single species of oligomer may be used or combinations of different species of oligomers. Suitable, illustrative (meth)acrylate oligomers include polyester (meth)acrylate oligomers, polyether (meth)acrylate oligomers, epoxy (meth)acrylate oligomers, and urethane (meth)acrylate oligomers. Regarding urethane (meth)acrylate oligomers, known methods may be used to prepare the compounds, such as by reacting a hydroxyl-terminated urethane compound with (meth)acrylic acid or by reacting an isocyanate-terminated compound with hydroxyalkyl (meth)acrylates. The oligomers may be characterized by their functionality, depending upon the degree of branching within the molecule. In embodiments, the oligomers utilized in the curable dielectric ink composition include difunctional compounds, trifunctional compounds, tetrafunctional compounds, pentafunctional compounds, hexafunctional compounds, or combinations thereof.

The oligomers utilized in the curable dielectric ink composition may each be characterized by a dynamic viscosity, as measured using a commercially available rheometer such as the Ares G2 from TA instruments. In embodiments, the oligomer has a viscosity in the range of from about 10,000 cP to about 200,000 cP at about 50° C. This includes embodiments in which the viscosity is in the range of from about 15,000 cP to about 35,000 cP at about 50° C. or from about 100,000 cP to about 200,000 cP at about 50° C. In embodiments, the oligomer has a viscosity in the range of from about 1,000 cP to about 20,000 cP at about 25° C. This includes embodiments in which the viscosity is in the range of from about 1,000 cP to about 15,000 cP at about 25° C. or from about 5,000 cP to about 10,000 cP at about 25° C. If more than one type of oligomer is present in the curable dielectric ink compositions, these viscosity values may refer to the viscosity values for each individual oligomer present in the curable dielectric ink composition.

The oligomers utilized in the curable dielectric ink composition may each be characterized by a glass transition temperature, $T_g$, as measured using modulated differential scanning calorimetry on a commercially available differential scanning calorimeter (e.g., Discovery DSC 2500 from TA Instruments). In embodiments, the $T_g$ is less than about 300° C., in embodiments less than about 200° C. or less than about 100° C. This includes embodiments in which the $T_g$ is in the range of from about 50° C. to about 300° C., from about 60° C. to about 200° C., or from about 60° C. to about 100° C. If more than one type of oligomer is present in the curable dielectric ink compositions, these $T_g$ values may refer the $T_g$ values for each individual oligomer present in the curable dielectric ink composition.

Suitable, illustrative polyester (meth)acrylate oligomers include those commercially available from Sartomer Chemical Co. under the product names CN293, CN299, CN292, CN296, CN2279, CN2262, CN2267, CN2200, CN2203, and CN2281.

Suitable, illustrative polyether (meth)acrylate oligomers include those commercially available from Rahn Corp. under the product names Genomer 3364, Genomer 3414, Genomer 3457, and Genomer 3497.

Suitable, illustrative epoxy (meth)acrylate oligomers include those commercially available from Sartomer Chemical Co. under the product names CN104Z, CN2102E, CN110, CN120Z, CN116, CN117, CN118, CN119, and CN2003B or commercially available from Rahn Corp. under the product names Genomer 2235, Genomer 2252, Genomer 2253, Genomer 2255, Genomer 2259, Genomer 2263, Genomer 2280, and Genomer 2281.

Suitable, illustrative urethane (meth)acrylate oligomers include aromatic urethane (meth)acrylates such as those commercially available from Sartomer Chemical Co. under the product names CN9782, CN9783, CN992, CN975 (hexafunctional), and CN972, or commercially available from Rahn Corp. under the product names Genomer 4622 and Genomer 4217. Aliphatic urethane (meth)acrylates include those commercially available from Sartomer Chemical Co. under the product names CN9004, CN9005, CN9006, CN9023, CN9028, CN9178, CN969, CN9788, CN986, CN989, CN9893, CN996, CN2920, CN3211, CN9001, CN9009, CN9010, CN9011, CN9071, CN9070, CN929, CN962, CN9025, CN9026, CN968, CN965, CN964, CN991, CN980, CN981, CN983, CN9029, CN9030, CN9031, CN9032, CN9039, CN9018, CN9024 and CN9013 or commercially available from Rahn Corp. under the product names Genomer 4188, Genomer 4215, Genomer 4230, Genomer 4267, Genomer 4269, Genomer 4312, Genomer 4316, Genomer 4425, Genomer 4590 and Genomer 4690. Other examples include difunctional urethane methacrylate oligomers commercially available from Sartomer Chemical Co. under the product names CN1963 and CN1964.

Other suitable, illustrative urethane (meth)acrylate oligomers include the Bomar™ series of polyester urethane acrylate oligomers commercially available from Dymax Corporation under the product names: BR-441B, BR-471, BR704P, BR-741, BR-741D (a difunctional aliphatic polyester urethane acrylate oligomer), BR-742P, BR-7432GI30, BR-744BT, BR742M, BR-941, BR-952 (a difunctional aliphatic urethane oligomer), BR-116, BR-146 and BR-202. Other examples include the difunctional polyester urethane methacrylate oligomer commercially available from Dymax Corporation under the product name Bomar™ XR-741MS.

Trifunctional urethane (meth)acrylate oligomers such as those commercially available from IGM Resins under the following product names may also be used: Photomer 6008, Photomer 6010, Photomer 6019, Photomer 6184, Photomer 6630, and Photomer 6892.

In embodiments, the curable dielectric ink composition includes greater than 10 weight % of the oligomer, based on the total weight of the curable dielectric ink composition. This includes embodiments in which the curable dielectric ink composition includes about 10 weight % to about 75 weight %, such as about 15 weight % to about 50 weight %, or about 15 weight % to about 30 weight %, or about 17 weight % to about 25 weight %, of the oligomer, based on the total weight of the curable dielectric ink composition. The maximum amount of oligomer depends upon the selected oligomer(s), but will generally be the amount at which it is still possible to jet the curable dielectric ink composition at the selected jetting temperature (e.g., about 85° C.) or at a maximum jetting temperature. In embodiments, the maximum amount of oligomer is about 75 weight %, based on the total weight of the curable dielectric ink composition. In embodiments, the curable dielectric ink composition includes from greater than about 50 weight % to 75 weight % of the oligomer. In embodiments in which more than one species of oligomer is present in the curable dielectric ink composition, these amounts refer to the total amount of oligomer in the curable dielectric ink composition.

The present curable dielectric ink compositions may be characterized by the ratio of oligomer to monomer (as determined by the (weight % of total oligomer)/(weight % of total monomer)). In embodiments, this ratio is at least about 0.2. This includes embodiments in which this ratio is about 0.2 to about 1.5, such as about 0.2 to about 1, or about 0.2 to about 0.7 or about 0.25 to about 0.5. The present curable dielectric ink compositions may also be characterized by the ratio of the sum of the weight percent of trifunctional monomers to the sum of the weight percent of all other monomers (as determined by the (weight % of total trifunctional monomers)/(weight % of total non-trifunctional monomers)). In embodiments, this ratio of trifunctional monomer to total sum of all non-trifunctional monomers ranges from about 1:8 to about 1:4, such as about 1.2:8 to about 1:5, or about 1.4:8 to about 1:5.

Amine Synergist Photoinitiator

Figure 2:
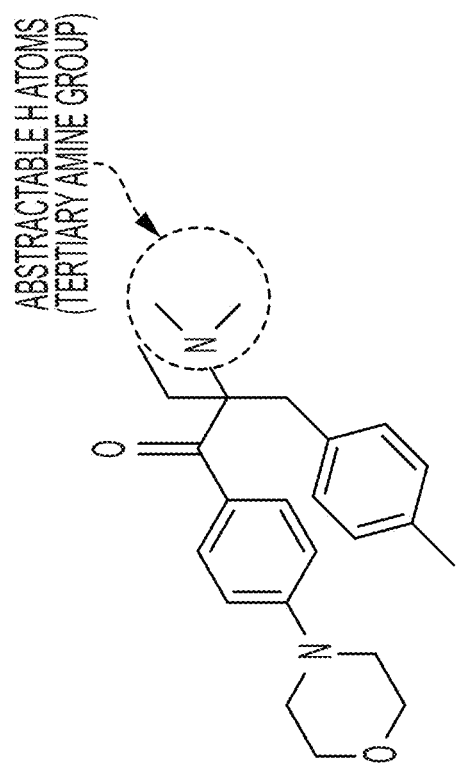
FIG. 2 shows a structural formula of an amine synergist photoinitiator, according to an example of the present disclosure.

The compositions of the present disclosure employ an amine synergist photoinitiator. Suitable amine synergist photoinitiators are photoactive organic compounds that include a tertiary amine group that can donate a hydrogen atom to a peroxy radical. An example of a suitable amine synergist photoinitiator is 2-(4-methylbenzyl)-2-(dimethylamino)-1-(4-morpholinophenyl) butan-1-one, which is commercially available as Irgacure 379, available from BASF of Florham Park, N.J. FIG. 2 shows the structure of 2-(4-methylbenzyl)-2-(dimethylamino)-1-(4-morpholinophenyl) butan-1-one, with the tertiary amine group encircled with a dashed line. Another example of a suitable amine synergist is Ethyl Michler's ketone (EMK). Examples of suitable commercially available amine synergist photoinitiators include oligoamines from Rahn such as Genomer 514, Genomer 5161, Genomer 5271, and Genomer 5275; amines such as Genocure MDEA, Genocure EMK, Genocure EHA, Genocure EPD; polymeric amine synergists such as Genopol AB-2. Other amine synergist examples from Sartomer include aminated acrylates such a CN371 and CN3715, CN3755. Other examples from IGM resins include Omnipol ASA (a polymeric amine), Esacure A 198 (difunctional amine synergist), Omnirad EDB, Omnirad EHA, Omnirad IADB, Omnirad 369 and Omnirad 379. Combinations of any of the above amine synergist photoinitiators can be employed.

A potential mechanism for how the amine synergist photoinitiators function to scavenge oxygen is shown in Scheme 1, below.

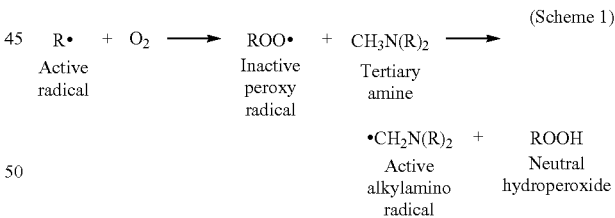

During UV curing of the dielectric films of the present disclosure, active radicals are formed, such as when a photoinitiator is activated with UV radiation or when an activated photoinitiator reacts with another compound, such as a monomer or oligomer. The active radicals can undesirably react with oxygen near the surface of the dielectric film, thereby forming peroxy radicals and in the process converting the active radical to an inactive peroxy radical. This is undesirable because the inactive peroxy radical is unable to promote the polymerization reaction, thereby resulting in inefficient and/or insufficient curing. However, the amine synergist photoinitiators of the present disclosure are able to donate a hydrogen atom to the inactive peroxy radical, and in the process form an active alkylamino radical, as shown in Scheme 1. The resulting active alkyamino radical is highly reactive, and is thereby able to promote the polymerization reaction of the (meth)acrylate compounds employed in the dielectric ink composition. Further, the active alkyamino radical is unaffected by oxygen at the surface of the dielectric film, thereby enabling adequate curing of the dielectric film at the surface.

The amount of amine synergist photoinitiator employed in the dielectric ink compositions can be any suitable amount that provides for the desired curing at the surface of the resulting dielectric film. As an example, the amount of amine synergist photoinitiator can range from about 0.5 wt. % to about 10 wt. %, such as about 1.5 wt. % to about 7.5 wt. %, or about 3 wt. % to about 6 wt. %, or about 3 wt. % to about 4.5 wt. %, based on the total weight of the wet dielectric ink composition.

Sensitizing Photoinitiator

The sensitizing photoinitiators are employed to harvest the long wavelength UV light that is employed for the curing process and to transfer energy to the photoinitiators. The particular sensitizing photoinitiator used can depend on the wavelength of UV light used for curing. In an embodiment, the sensitizing photoinitiator absorbs UV radiation in a range of about 270 nm to about 410 nm, thereby forming an excited photoinitiator (also referred to herein as an "excited triplet sensitizer"). The excited triplet sensitizer can, in turn, pass its triplet energy to the amine synergist photoinitiator and/or other photoinitiators used in the dielectric ink composition.

Figure 3:
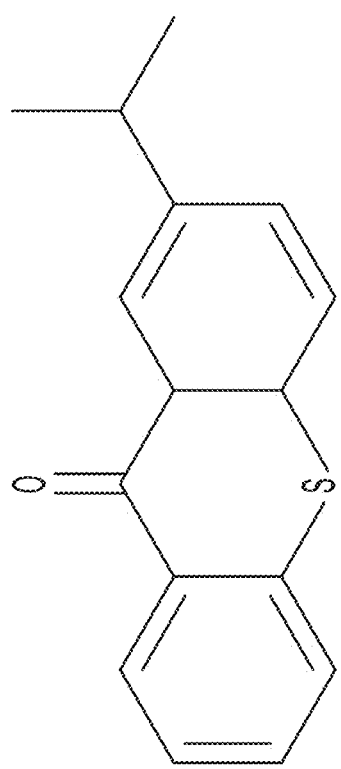
FIG. 3 shows a structural formula of a sensitizing photoinitiator, according to an example of the present disclosure.

Any suitable sensitizing photoinitiator can be employed that can absorb UV light at the wavelength of light used for curing, and transfer the energy to other photoinitiators in the dielectric ink composition to enable the generation of free radicals so as to initiate the polymerization process. An example of a suitable sensitizing photoinitiator is 2-isopropyl thioxanthone, which is a thioxanthone photoinitiator commercially available as Darocure ITX from BASF of Florham Park, N.J. FIG. 3 shows the structure of 2-isopropyl thioxanthone. Examples of other suitable sensitizing photoinitiators include thioxanthones such as 2,4-diethylthioxanthone (DETX), 2-chlorothioxanthone (CTX), 2,4-dimethylthioxanthone (RTX) and 1-chloro-4-propoxythioxanthone (CPTX). Other examples of commercially available sensitizers include: Rahn Corporation (Genopol TX-2 (polymeric thioxanthone), Genocure ITX, Genocure DETX. IGM Resins (Omnipol TX, Omnipol 3TX, Omnipol BL728, all polymeric); Omnirad ITX, Omnirad DETX. Lambson Group Ltd: Speedcure ITX, Speedcure 2-ITX, Speedcure 7010 (a CPTX), Speedcure 7010-L (polymeric).

The amount of sensitizing photoinitiator employed in the dielectric ink compositions can be any suitable amount that provides for the desired degree of polymerization to achieve adequate curing. As an example, the amount of sensitizing photoinitiator can range from about 0.5 wt. % to about 10 wt. %, such as about 1.5 wt. % to about 7.5 wt. %, or about 3 wt. % to about 6 wt. %, or about 3 wt. % to about 4.5 wt. %, based on the total weight of the wet dielectric ink composition.

The combination of the amine synergist photoinitiator and the sensitizing photoinitiator in the dielectric composition results in the acceleration of curing and allows for the scavenging of oxygen at the surface of the dielectric layer. Thus, an adequate degree of curing can more efficiently be achieved at the surface of the dielectric layer (e.g., a complete surface cure or a substantially complete surface cure).

Phosphine Oxide Photoinitiator

A phosphine oxide photoinitiator is also employed in the compositions of the present disclosure. The phosphine oxide is a long wavelength UV absorber, particularly suited for LED light and highly pigmented coatings, and is also suited for depth cure due to a high degree of penetration into the coating. An example of a suitable phosphine oxide photoinitiator is Phenylbis(2,4,6-trimethylbenzoyl)phosphine oxide, which is commercially available as Irgacure 819, from BASF of Florham Park, N.J. Other suitable phosphine oxides include Diphenyl-(2,4,6, Trimethylbenzoyl)phosphine oxide (TPO) and Ethyl (2,4,6-trimethylbenzoyl)phenylphosphinate (TPO-L). Examples of commercially available phosphine oxide photoinitiators include Lucirin TPO and Lucirin TPO-L from BASF; Genocure TPO and Genocure TPO-L from Rahn AG of Zurich, Switzerland; and Omnirad TPO, Omnirad TPO-L and Omnirad 819, from IGM Resins of Charlotte, N.C. Combinations of any of the above phosphine oxides can be employed.

The amount of phosphine oxide photoinitiator employed in the dielectric ink compositions can be any suitable amount that provide for the desired polymerization so as to provide adequate curing. As an example, the amount of phosphine oxide photoinitiator can range from about 0.5 wt. % to about 10 wt. %, such as about 1.5 wt. % to about 7.5 wt. %, or about 3 wt. % to about 6 wt. %, or about 3 wt. % to about 4.5 wt. %, based on the total weight of the wet dielectric ink composition.

Optional Photoinitiators

In an embodiment, the only photoinitiators employed in the dielectric ink compositions are the amine synergist photoinitiator, the sensitizing photoinitiator and the phosphine oxide photoinitiator. Alternatively, the dielectric ink composition can further contain one or more additional photoinitiators other than those listed above. Any photoinitiator that absorbs radiation, e.g., UV or visible radiation, to induce free radical polymerization reactions between the selected oligomers and/or selected monomers may optionally be used. Suitable, illustrative optional photoinitiators such as benzophenones, benzoin ethers, benzil ketals, α-hydroxyalkylphenones, α-alkoxyalkylphenones, α-aminoalkylphenones, and acylphosphine photoinitiators may be used. The photoinitiator 2,4,6 Trimethylbenzoyldiphenylphosphine oxide (TPO) may be used. Suitable, illustrative optional photoinitiators include those commercially available from BASF under the product names Irgacure-184 and Irgacure TPO may be used.

The optional photoinitiator may be included in the curable dielectric ink composition in various suitable amounts. In embodiments, curable dielectric ink composition includes from about 0.1 weight % to about 10 weight % of the optional photoinitiator, based on the total weight of the wet dielectric ink composition. This includes embodiments in which the curable dielectric ink composition includes from about 0.1 weight % to about 8 weight % or from about 0.1 weight % to about 6 weight % of the photoinitiator based on the total weight of the wet dielectric ink composition. In embodiments in which more than one species of optional photoinitiator is present in the curable dielectric ink composition, these amounts may refer to the amount of each optional photoinitiator in the curable dielectric ink composition.

Other Optional Ingredients

A variety of other additive ingredients may optionally be added to the dielectric ink composition. Suitable, illustrative additives include colorants, polymerization inhibitors to promote thermal stability, and antioxidant agents. When present, additives may be included in various suitable amounts. In embodiments, the curable dielectric ink composition includes from about 0.1 weight % to about 15 weight % of each of the thermal stability and/or antioxidant agents additive, based on the total weight of the curable dielectric ink composition, such as about 0.1 weight % to about 10 weight % or from about 0.1 weight % to about 5 weight % of the additive based on the total weight of the curable dielectric ink composition. In embodiments in which more than one species of additive is present in the curable dielectric ink composition, these amounts may refer to the amount of each of the additives in the curable dielectric ink composition.

The dielectric ink compositions of the present disclosure can be clear or colored. If a colorant is employed, the colorant can be chosen from a dye, a pigment or mixtures thereof. Any dye or pigment may be chosen, provided that it is capable of being dispersed or dissolved in the dielectric ink and is compatible with the ink components.

The colorant may be present in the dielectric ink composition in any desired or effective amount to obtain the desired color or hue such as, for example, from about 0.1 percent by weight of the ink to about 50 percent by weight of the ink, or from about 0.2 percent by weight of the ink to about 20 percent by weight of the ink, or from about 0.5 percent by weight of the ink to about 10 percent by weight of the wet dielectric ink composition.

Any other ingredients suitable for use in printable inks, such as, for example, solvents, can also optionally be included in the compositions of the present disclosure. One of ordinary skill in the art would readily be able to determine other ingredients that can be employed.

The ink compositions can be prepared by any desired or suitable method. For example, various curable dielectric ink compositions may be formed according to the guidance provided above, e.g., curable dielectric ink compositions having various combinations of the disclosed components at the disclosed amounts and ratios. Such curable dielectric ink compositions may have (in uncured and uncured forms) various combinations of the characteristics disclosed throughout this specification. In embodiments, the curable dielectric ink compositions consist or consist essentially of the disclosed components, i.e., the oligomer component, the monomer component, the photoinitiator component, and optionally, the additive component.

The curable dielectric ink compositions may be formed by combining the selected components at the selected amounts under conditions sufficient to form a homogeneous liquid mixture. Illustrative methods are described in the Examples, below.

The wet dielectric ink composition prior to curing may be characterized by a complex viscosity that is suitable for jetting using an ink jet printer or aerosol printer. These viscosity values may be referred to as "jettable viscosity values" in that curable dielectric ink compositions having such viscosity values are able to be jetted by various digital additive manufacturing systems at typical jetting temperatures (e.g., 85° C.). For example, the wet ink composition can have a complex viscosity of about 2 cps to about 20 cps, such as about 5 cps to 15 cps or about 5 cps to 10 cps, at 85° C. The viscosity can be obtained by measuring complex viscosities over a 100° C. to 25° C. temperature range using an Ares G2 rheometer equipped with a 25 mm Parallel plate and Peltier heating system. Samples of the inks are loaded on the rheometer at 102° C., allowed to equilibrate, then swept over the temperature range from about 100° C. to 25° C. at a rate of 1.5° C./min at 10 rad/s.

Device

Figure 4A:
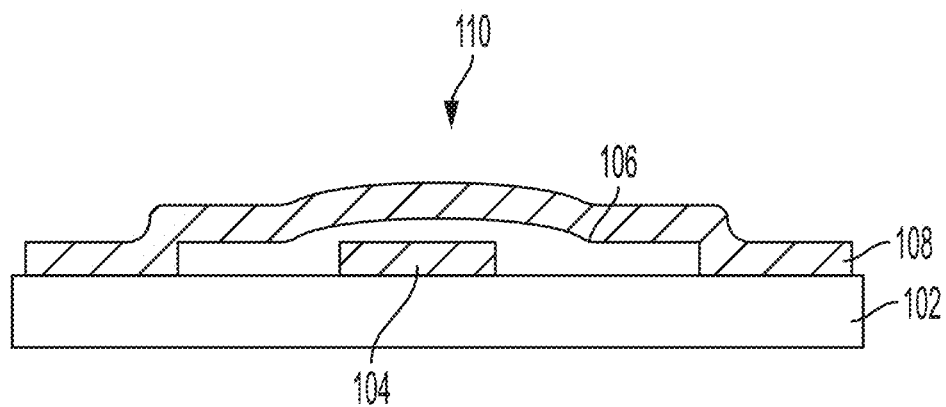
FIG. 4A illustrates a cross-sectional view of a dielectric layer disposed at a junction between a first conductive line and a second conductive line, according to an embodiment of the present disclosure.
Figure 4B:
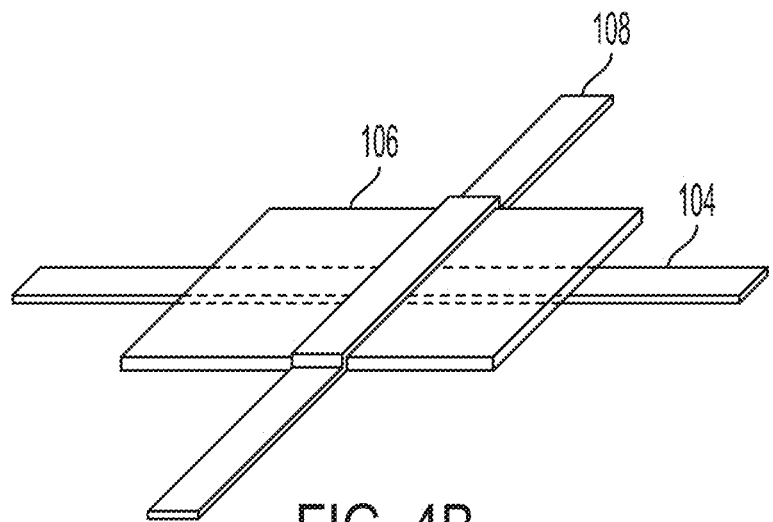
FIG. 4B illustrates a perspective view of a dielectric layer disposed at a junction between a first conductive line and a second conductive line, according to an embodiment of the present disclosure.

Referring to FIGS. 4A and 4B, the present disclosure is also directed to a device 100 comprising a substrate 102. A first conductive line 104 is disposed over the substrate 102. A second conductive line 108 is disposed over the first conductive line 104 at a junction 110. A dielectric layer 106 is disposed at the junction 110 between the first conductive line 104 and the second conductive line 108, so as to electrically insulate the conductive lines 104, 108 from each other. The dielectric layer 106 is formed by printing any of the dielectric ink compositions described herein.

The substrate 102 can be any desired substrate on which the dielectric inks of the present disclosure can be printed. Example substrates 102 include paper products, such as cardboard or copy paper, fabrics, textile products, plastics, polymeric films, inorganic recording mediums such as ceramics, inorganic dielectric materials (e.g., silicon dioxide), semiconductors, metals, wood, circuit boards, partially or fully fabricated electronic devices such as transistors, and the like.

In an embodiment, the dielectric layer 106 (sometimes referred to herein as a "dielectric film") can be printed only over the portion of conductive line 104 and/or portions of the substrate in proximity to the junction 110. Alternatively, the dielectric layer 106 can be formed over the entire conductive line 104 and/or the entire substrate 102. The thickness of the dielectric layer 106 can be any thickness that will provide the desired electrical insulation between the conductive lines. For example, the thickness of the dielectric layer 106 can range from about 50 nm to about 1 millimeter or more, such as about 100 nm to about 500 microns or about 200 nm to about 100 microns.

The dielectric layer 106 can be deposited by any printing techniques suitable for printing dielectric inks, including inkjet printing and aerosol jet printing. Any suitable printing device may be used for printing the dielectric inks. The phrase "printing device" as used herein encompasses any apparatus, such as a 3D printer, inkjet printer, aerosol jet printer, digital copier, bookmaking machine, facsimile machine, multi-function machine, and the like, which can jet ink to perform a print outputting function for any purpose.

The dielectric layer 106 can be cured using any suitable ultraviolet light source at any suitable UV wavelength. In an example, the light source is an LED emitting UV radiation at about 395 nm.

Dielectric layers made using the dielectric ink compositions comprising the amine synergist and sensitizing photoinitiators of the present disclosure can be cured more quickly, potentially in fewer passes (e.g., a single pass) of a UV LED light source, compared to dielectric layers made using the same dielectric ink compositions except that other photoinitiators (e.g., the photoinitiators of the Comparative Example in Table 6 below) are employed without the amine synergist and sensitizing photoinitiators of the present disclosure.

EXAMPLES

Examples 1 to 35: Ink Compositions

General procedure: one or both of the following small scale or large scale procedures were used to prepare compositions as shown in the examples of Tables 1 to 6 below. Tables 1 to 5 summarize the example formulations according to the present disclosure. A comparative example is shown in Table 6. All percentages are by weight relative to the total weight of the dielectric ink composition. Examples 1-9, 11-15, and 17-31 were prepared using the small scale preparation procedures (A). Examples 32-35 were prepared using the large scale procedures (B). Examples 10 and 16 were prepared using both small and large scale procedures.

Small Scale Procedure: To an amber glass 30 mL bottle was added the components in the percentages shown in the tables below, along with a magnetic stir bar. The bottle was transferred to a Vario-Mag thermowell set to 80° C. with stirring at 350 RPM. After 30 minutes, the ink was removed from the heater/stirrer.

Large Scale (>20 mL) Procedure: A glass beaker was fitted to a jacketed heating mantle, and heated to 80° C. Next, an overhead mixer with a 4-bladed impeller was immersed, and the various components were added to the beaker. The mixture was heated for 30 minutes with mixing at 300 RPM until all the solid components were completely dissolved, and the mixture was a clear, homogenous liquid. Finally, the material was passed through a 1 um Parker filter under pressure to furnish the final ink composition.

TABLE 1

Example Dielectric Ink Compositions

| Component | Compound Name | Description | Preparation Procedure | | | |
|---|---|---|---|---|---|---|
| | | | A Ex.1 | A Ex.2 | A Ex.3 | A Ex.4 |
| SR506A | isobornyl acrylate | Monomer | 33.2% | 31.2% | 27.1% | 37.6% |
| SR272 | triethylene glycol diacrylate | Monomer | 13.6% | 12.7% | 11.1% | 15.0% |
| SR268 | tetraethylene glycol diacrylate | Monomer | 6.2% | 5.8% | 5.1% | 6.8% |
| SR368 | tris(2-hydroxy ethyl acrylate) isocyanurate | Monomer | 10.1% | 9.5% | 8.2% | 11.2% |
| BR741D | difunctional aliphatic urethane oligomer | Oligomer | 18.4% | 17.3% | 15.0% | 20.3% |
| BR952 | difunctional aliphatic urethane oligomer | Oligomer | | | | |
| Irgacure 819 | Phenylbis(2,4,6-trimethylbenzoyl)phosphine oxide | Photoinitiator | 4.5% | 4.5% | 4.5% | 3.0% |
| Darocur ITX | 2-isopropyl thioxanthone | Photoinitiator | 4.5% | 4.5% | 4.5% | 3.0% |
| Irgacure 379 | 2-(4-methylbenzyl)-2-(dimethylamino)-1-(4-morpholinophenyl)butan-1-one | Photoinitiator | 4.5% | 4.5% | 4.5% | 3.0% |
| Ethyl Michler's Ketone | 1-Hydroxycyclohexyl phenyl ketone | Photoinitiator | | | | |
| 20% pigment dispersion (cyan) | Diphenyl(2,4,6-trimethylbenzoyl)phosphine oxide | Colourant | 5.0% | 10.0% | 20.0% | |
| TOTAL | | | 100.0% | 100.0% | 100.0% | 100.0% |

TABLE 2

Example Dielectric Ink Compositions

| Component | Preparation Procedure | | | | | | | | |
|---|---|---|---|---|---|---|---|---|---|
| | A Ex.5 | A Ex.6 | A Ex.7 | A Ex.8 | A Ex.9 | A and B Ex.10 | A Ex.11 | A Ex.12 | A Ex.13 |
| SR506A | 33.4% | 29.7% | 35.9% | 35.9% | 38.9% | 35.2% | 42.2% | 37.0% | 33.4% |
| SR272 | 13.7% | 12.2% | 14.7% | 14.7% | 15.9% | 14.4% | 15.00% | 15.2% | 13.7% |
| SR268 | 6.2% | 5.6% | 6.7% | 6.7% | 7.3% | 6.6% | 6.80% | 6.9% | 6.2% |
| SR368 | 10.2% | 9.1% | 10.9% | 10.9% | 11.9% | 10.7% | 11.20% | 11.3% | 10.2% |
| BR741D | 18.5% | 16.5% | 19.9% | 19.9% | 21.6% | 19.5% | 20.30% | 20.6% | 18.5% |
| BR952 | | | | | | | | | |
| Irgacure 819 | 6.0% | 9.0% | 6.0% | 6.0% | 1.5% | 4.5% | 1.50% | 3.0% | 6.0% |
| Darocur ITX | 6.0% | 9.0% | 6.0% | | 1.5% | 4.5% | 1.50% | 3.0% | 6.0% |
| Irgacure 379 | 6.0% | 9.0% | | 6.0% | 1.5% | 4.5% | | | |
| Ethyl Michler's Ketone | | | | | | | 1.50% | 3.0% | 6.0% |
| 20% pigment dispersion (cyan) | | | | | | | | | |
| TOTAL | 100.0% | 100.0% | 100.0% | 100.0% | 100.0% | 100.0% | 100.0% | 100.0% | 100.0% |

TABLE 3

Example Dielectric Ink Compositions

| Component | Preparation Procedure | | | | | | | | |
|---|---|---|---|---|---|---|---|---|---|
| | A Ex.14 | A Ex.15 | A and B Ex.16 | A Ex.17 | A Ex.18 | A Ex.19 | A Ex.20 | A Ex.21 | A Ex.22 |
| SR506A | 37.7% | 37.1% | 37.7% | 37.1% | 36.5% | 37.1% | 36.5% | 37.1% | 36.5% |
| SR272 | 15.4% | 15.2% | 15.4% | 15.2% | 14.9% | 15.2% | 14.9% | 15.2% | 14.9% |
| SR268 | 7.0% | 6.9% | 7.0% | 6.9% | 6.8% | 6.9% | 6.8% | 6.9% | 6.8% |
| SR368 | 11.5% | 11.3% | 11.5% | 11.3% | 11.1% | 11.3% | 11.1% | 11.3% | 11.1% |
| BR741D | 20.9% | 20.6% | 20.9% | 20.6% | 20.2% | 20.6% | 20.2% | 20.6% | 20.2% |
| BR952 | | | | | | | | | |
| Irgacure 819 | 1.5% | 1.5% | 1.5% | 1.5% | 1.5% | 3.0% | 3.0% | 3.0% | 3.0% |
| Darocur ITX | 1.5% | 3.0% | 4.5% | 4.5% | 4.5% | 1.5% | 3.0% | 4.5% | 4.5% |
| Irgacure 379 | 4.5% | 4.5% | 1.5% | 3.0% | 4.5% | 4.5% | 4.5% | 1.5% | 3.0% |
| Ethyl Michler's Ketone | | | | | | | | | |
| 20% pigment dispersion (cyan) | | | | | | | | | |
| TOTAL | 100.0% | 100.0% | 100.0% | 100.0% | 100.0% | 100.0% | 100.0% | 100.0% | 100.0% |

TABLE 4

Example Dielectric Ink Compositions

| Component | Preparation Procedure | | | | | | | | |
|---|---|---|---|---|---|---|---|---|---|
| | A Ex.23 | A Ex.24 | A Ex.25 | A Ex.26 | A Ex.27 | A Ex.28 | A Ex.29 | A Ex.30 | A Ex.31 |
| SR506A | 35.9% | 37.7% | 37.1% | 36.5% | 37.1% | 36.5% | 35.9% | 36.5% | 35.9% |
| SR272 | 14.7% | 15.4% | 15.2% | 14.9% | 15.2% | 14.9% | 14.7% | 14.9% | 14.7% |
| SR268 | 6.7% | 7.0% | 6.9% | 6.8% | 6.9% | 6.8% | 6.7% | 6.8% | 6.7% |
| SR368 | 10.9% | 11.5% | 11.3% | 11.1% | 11.3% | 11.1% | 10.9% | 11.1% | 10.9% |
| BR741D | 19.9% | 20.9% | 20.6% | 20.2% | 20.6% | 20.2% | 19.9% | 20.2% | 19.9% |
| BR952 | | | | | | | | | |
| Irgacure 819 | 3.0% | 4.5% | 4.5% | 4.5% | 4.5% | 4.5% | 4.5% | 4.5% | 4.5% |
| Darocur ITX | 4.5% | 1.5% | 1.5% | 1.5% | 3.0% | 3.0% | 3.0% | 4.5% | 4.5% |
| Irgacure 379 | 4.5% | 1.5% | 3.0% | 4.5% | 1.5% | 3.0% | 4.5% | 1.5% | 3.0% |
| Ethyl Michler's Ketone | | | | | | | | | |
| 20% pigment dispersion (cyan) | | | | | | | | | |
| TOTAL | 100.0% | 100.0% | 100.0% | 100.0% | 100.0% | 100.0% | 100.0% | 100.0% | 100.0% |

TABLE 5

Example Dielectric Ink Compositions

| Component | Preparation Procedure | | | |
|---|---|---|---|---|
| | B Ex.32 | B Ex.33 | B Ex.34 | B Ex.35 |
| SR506A | 35.2% | 31.2% | 33.4% | 32.2% |
| SR272 | 14.4% | 12.8% | 13.7% | 13.8% |
| SR268 | 6.6% | 5.8% | 6.2% | 6.8% |
| SR368 | 10.7% | 9.5% | 10.2% | 10.5% |
| BR741D | | 17.3% | 18.6% | 18.3% |
| BR952 | 19.6% | | | |
| Irgacure 819 | 4.5% | 4.5% | 4.3% | 4.5% |
| Darocur ITX | 4.5% | 4.5% | 4.3% | 4.5% |
| Irgacure 379 | 4.5% | 4.5% | 4.3% | 4.5% |
| Ethyl Michler's Ketone | | 10.0% | 5.0% | 5% |
| 20% pigment dispersion (cyan) | | | | |
| TOTAL | 100.0% | 100.0% | 100.0% | 100.0% |

TABLE 6

Comparative Dielectric Ink Compositions

Preparation Procedure

| Material | Compound name | Description | A and B Comparative Example Wt% |
|---|---|---|---|
| SR506A | isobornyl acrylate | monomer | 39.4% |
| SR272 | triethylene glycol diacrylate | monomer | 16.2% |
| SR268 | tetraethylene glycol diacrylate | monomer | 7.4% |
| SR368 | tris (2-hydroxy ethyl acrylate) isocyanurate | monomer | 12.0% |
| BR741D | difunctional aliphatic urethane oligomer | oligomer | 21.8% |
| Irgacure 819 | Phenylbis(2,4,6-trimethylbenzoyl)phosphine oxide | photoinitiator | — |
| Darocure ITX | 2-isopropyl thioxanthone | photoinitiator (sensitizer) | — |
| Irgacure 379 | 2-(4-methylbenzyl)-2-(dimethylamino)-1-(4-morpholinophenyl) butan-1-one | photoinitiator | — |
| Irgacure 184 | 1-Hydroxycyclohexyl phenyl ketone | photoinitiator | 2.3% |
| Lucirin TPO | Diphenyl(2,4,6-trimethylbenzoyl)phosphine oxide | photoinitiator | 1.0% |
| TOTAL | | | 100.0% |

Figure 5:
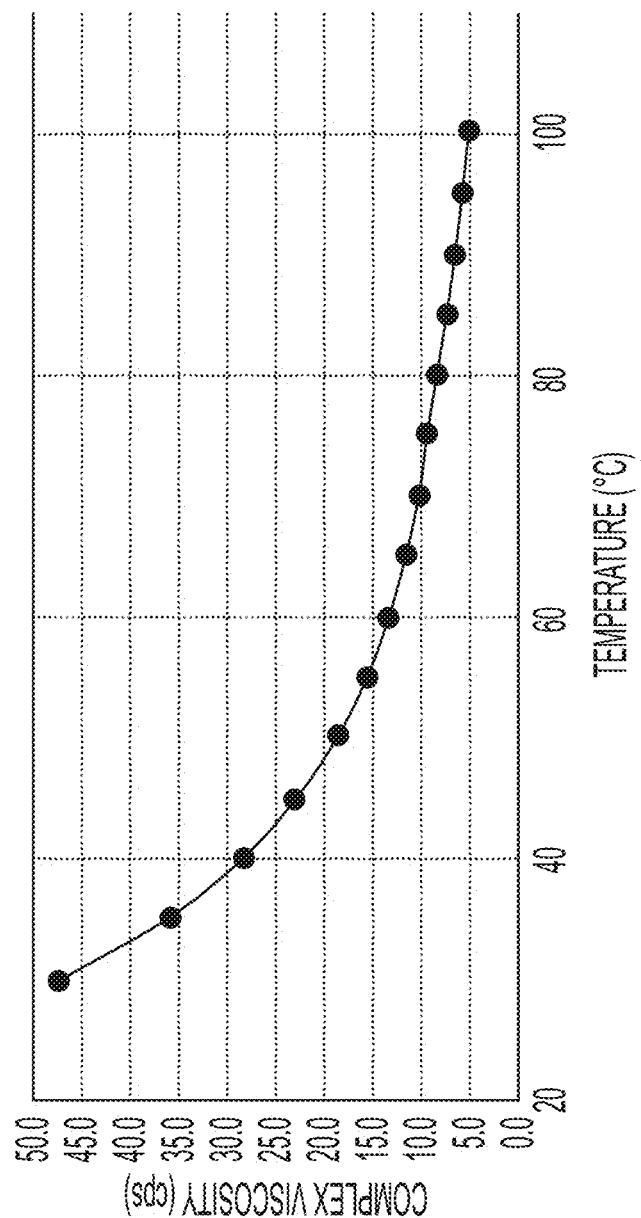
FIG. 5 shows a graph of viscosity data for a dielectric ink composition, according to an embodiment of the present disclosure.

Dielectric Ink Characterization:

The viscosity of the ink of Example 10 (Table 2) was measured by performing a temperature sweep test ranging from high temperature to low temperature. In particular, the viscosity was obtained by measuring complex viscosities over a 100° C. to 25° C. temperature range using an Ares G2 rheometer equipped with a 25 mm Parallel plate and Peltier heating system. Samples of the inks are loaded on the rheometer at 102° C., allowed to equilibrate, then swept over the temperature range to 25° C. at a rate of 1.5° C./min at 10 rad/s. The results are shown in FIG. 5.

Dielectric Properties of UV Curable Dielectric Ink

The capacitance of the UV curable dielectric material made using the ink of Example 10 was measured to be about 5.25 nF/cm$^2$ and the dielectric constant was calculated to be about 3.90.

Example 36: Dielectric Ink Coating and Overprinting with Conductive Ink

A square gap coater with a 1 mil gap was used to draw down a thin film of dielectric ink of Example 10 on a precleaned 2"×3" microscope slide. The ink film was then cured under a Phoseon 12W UV LED by keeping the lamp stationary under the UV light source for 5 seconds, at a gap of 6 centimetres. A nanoparticle-based silver ink was overprinted on top of the cured ink film using a Dimatix DMP2800 printer. The silver ink printing was carried out as follows: ink was jetted at room temperature at a print speed of 5 m/sec, and the drop mass was 7 ng. A standard test pattern was printed directly onto the cured dielectric film coating on glass, and then thermally annealed in an oven at 120° C. for 30 minutes.

Example 37: Dielectric Ink Coating on PET Substrate and Overprinting with Conductive Ink A square gap coater with a 1 mil gap was used to draw down coat a thin film of dielectric ink of Example 10 on precleaned PET substrates. The films were cured under a Phoseon 16W UV LED lamp with the substrate moving on a belt with speeds ranging from 190.5 mm/s to 381 mm/sec, (energy densities ranging from 1152 mJ/cm$^2$ to 576 mJ/cm$^2$ and power of 10.1 W/cm$^2$).

Silver nanoparticle (AgNP) ink was printed using a Xerox printhead on an in-house inkjet printer with the platen heated to 70° C. The AgNP ink printed excellent lines. The AgNP ink was sintered using a Novacentrix Pulseforge 1200 using the following settings: 400 V, envelope 4000 µs, 10 µpulses, a duty cycle of 50% which gave an energy of 4.12 J/cm$^2$.

Electrical Testing:

The photosintered silver lines of Example 37 were assessed for conductivity by measuring the resistance of an 8 pixel line. The average resistance measured ~8Ω. The dimensions of the lines were roughly: length ~50 mm, height ~2.8 µm, width ~408 µm, to give a calculated bulk conductivity of ~9×10$^4$ S/cm.

Figure 6:
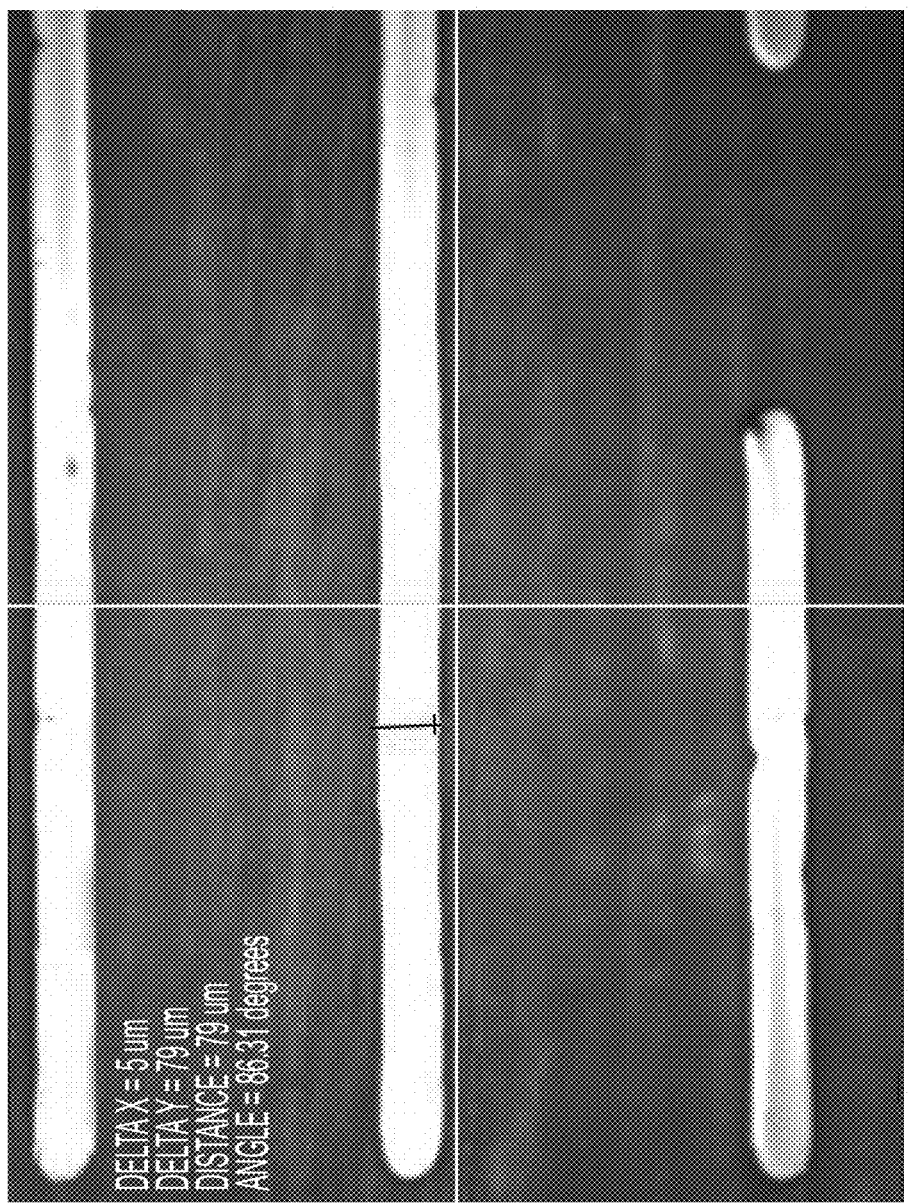
FIG. 6 illustrates a microscope image of a dielectric layer with silver lines printed thereon, the dielectric layer having been made with a dielectric ink composition, according to an example of the present disclosure.
Figure 7:
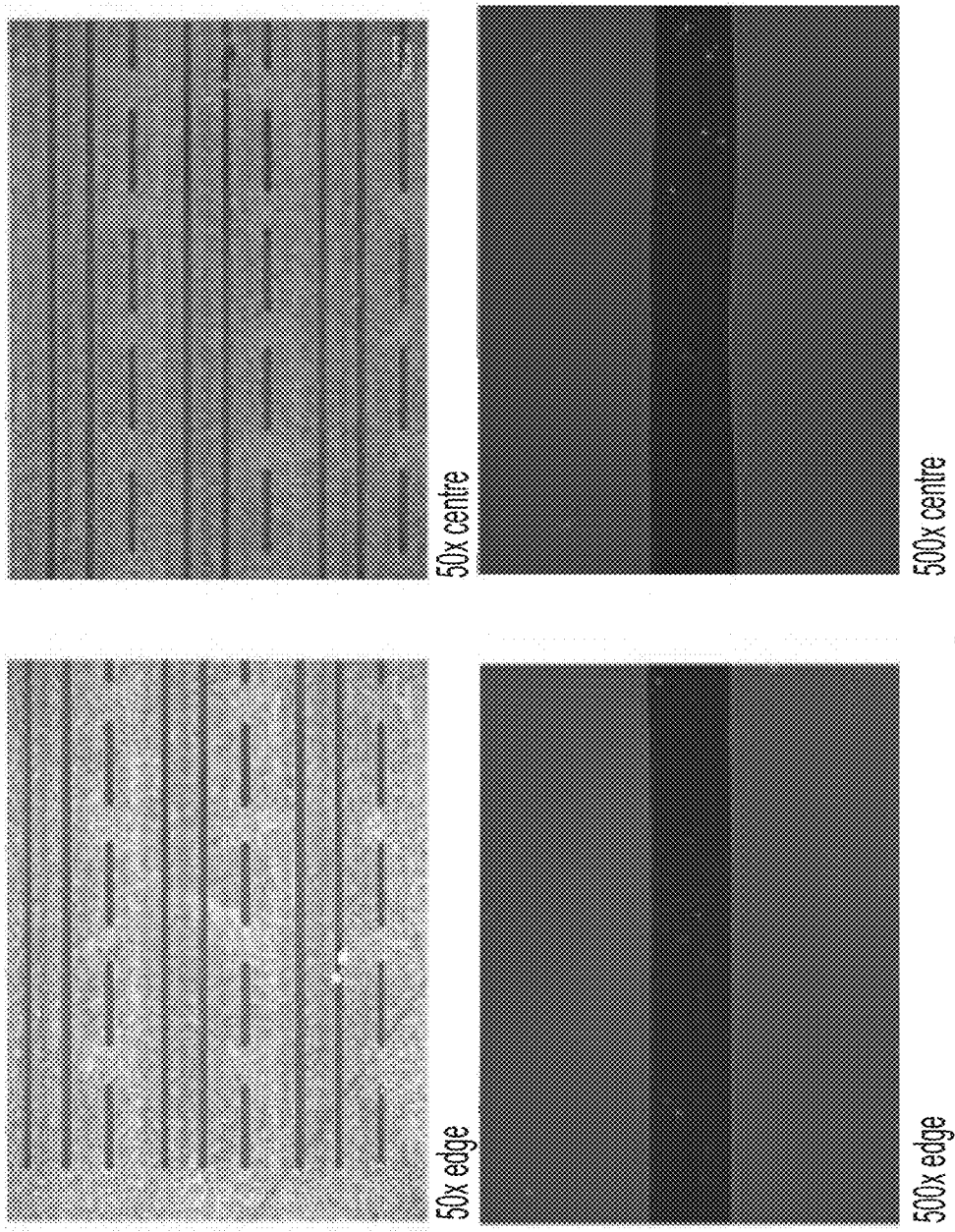
FIG. 7 illustrates microscope images of a dielectric layer with silver lines printed thereon, the dielectric layer having been made with a dielectric ink composition, according to an example of the present disclosure.
Figure 8:
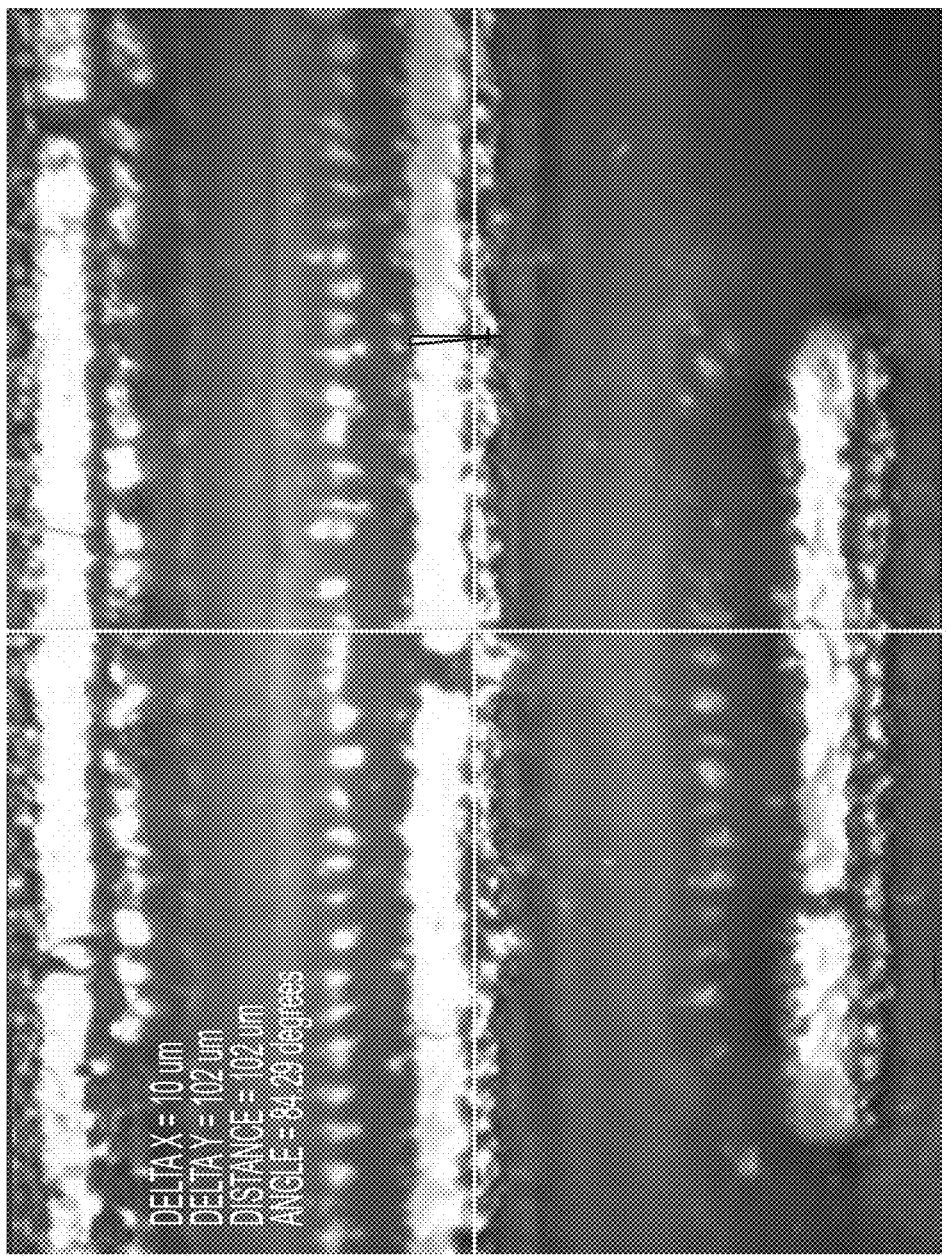
FIG. 8 illustrates a microscope image of a dielectric layer with silver lines printed thereon, the dielectric layer having been made with a comparative dielectric ink composition, according to the examples described herein.
Figure 9:
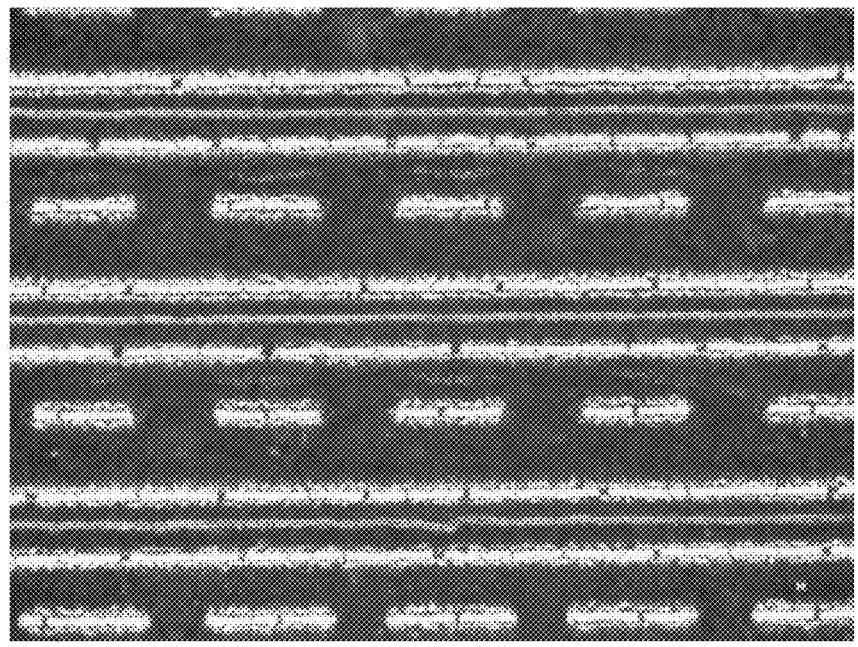
FIG. 9 illustrates a microscope image of a dielectric layer with silver lines printed thereon, the dielectric layer having been made with a comparative dielectric ink composition, according to the examples described herein.

Improved nanoAg line printability was demonstrated with an improved UV LED surface cure of the inventive dielectric ink material. No evidence of uncured surface residue was seen, whereas lines printed with the ink of the Comparative Example (Table 6) were sticky and smeared when rubbed. FIGS. 6 to 9 illustrate these comparisons. In particular, FIGS. 6 and 7 illustrate microscope images of a dielectric made with the ink of Example 10, with silver ink lines printed thereon. FIGS. 8 and 9 illustrate microscope images of a dielectric made with the ink of the Comparative Example, with silver ink lines printed thereon. The silver ink lines printed on the dielectric made with the dielectric ink of Example 10 show improved uniformity and continuity. In summary, the dielectric made with the ink of Example 10 was a fully cured, tack-free film that was shown to support overprinting of conductive silver ink.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A dielectric ink composition, comprising:
    at least one (meth)acrylate compound selected from the group consisting of (meth)acrylate monomers, (meth)acrylate oligomers and combinations thereof, wherein the at least one (meth)acrylate compound includes at least one of the (meth)acrylate oligomers and at least four of the (meth)acrylate monomers, the at least four (meth)acrylate monomers comprising at least one monofunctional (meth)acrylate, at least two difunctional (meth)acrylates and at least one trifunctional (meth)acrylate, the at least one monofunctional (meth)acrylate) and the at least two difunctional (meth)acrylates comprising a lowest viscosity mono-functional or di-functional monomer and a highest viscosity mono-functional or di-functional monomer, a ratio of the weight % of the lowest viscosity mono-functional or di-functional monomer to the weight % of the highest viscosity mono-functional or di-functional monomer being at least about 2, and the at least one (meth)acrylate oligomer being in an amount ranging from about 10 wt. % to about 70 wt. %, based on the total weight of the dielectric ink composition;
    a sensitizing photoinitiator;
    an amine synergist photoinitiator; and
    a phosphine oxide photoinitiator.

2. The composition of claim 1, wherein the at least one (meth)acrylate oligomer is in an amount ranging from about 15 wt. % to about 70 wt. %, based on the total weight of the dielectric ink composition, and wherein a ratio of the weight % of the total amount of (meth)acrylate oligomers to the weight % of the total amount of (meth)acrylate monomers is at least about 0.2.

3. The composition of claim 1, wherein a ratio of the weight % of the lowest viscosity mono-functional or di-functional monomer to the weight % of the highest viscosity mono-functional or di-functional monomer ranges from 5 to about 10.

4. The composition of claim 1, wherein the at least one (meth)acrylate oligomer is selected from the group consisting of polyester (meth)acrylate oligomers, polyether (meth)acrylate oligomers, epoxy (meth)acrylate oligomers, and urethane (meth)acrylate oligomers.

5. The composition of claim 1, wherein the at least two difunctional (meth)acrylates are triethylene glycol diacrylate and tetraethylene glycol diacrylate.

6. The composition of claim 5, wherein the at least one trifunctional (meth)acrylate is tris(2-hydroxy ethyl acrylate) isocyanurate.

7. The composition of claim 1, wherein the sensitizing photoinitiator is a thioxanthone photoinitiator.

8. The composition of claim 1, wherein the amine synergist photoinitiator is selected from the group consisting of 2-(4-methylbenzyl)-2-(dimethylamino)-1-(4-morpholinophenyl) butan-1-one; Ethyl Michler's ketone (EMK) and combinations thereof.

9. The composition of claim 1, wherein the phosphine oxide photoinitiator is selected from the group consisting of Phenylbis(2,4,6-trimethylbenzoyl)phosphine oxide; Diphenyl-(2,4,6, Trimethylbenzoyl)phosphine oxide (TPO); Ethyl (2,4,6-trimethylbenzoyl)phenylphosphinate (TPO-L) and combinations thereof.

10. The composition of claim 1, further comprising at least one optional ingredient selected from the group consisting of colorants, polymerization inhibitors, antioxidants and solvents.

11. A method comprising inkjet printing the dielectric ink composition of claim 1.

12. A method comprising aerosol jet printing the dielectric ink composition of claim 1.

13. A device comprising:
    a substrate;
    a first conductive line disposed over the substrate;
    a second conductive line disposed over the first conductive line at a junction; and
    a dielectric layer disposed at the junction between the first conductive line and the second conductive line so as to electrically insulate the first conductive line from the second conductive line, the dielectric layer being formed by printing a dielectric ink composition, the dielectric ink composition comprising:
        at least one (meth)acrylate compound selected from the group consisting of (meth)acrylate monomers, (meth)acrylate oligomers and combinations thereof; wherein the at least one (meth)acrylate compound includes at least one of the (meth)acrylate oligomers and at least four of the (meth)acrylate monomers, the at least four (meth)acrylate monomers comprising at least one monofunctional (meth)acrylate, at least two difunctional (meth)acrylates and at least one trifunctional (meth)acrylate, the at least one monofunctional (meth)acrylate) and the at least two difunctional (meth)acrylates comprising a lowest viscosity mono-functional or di-functional monomer and a highest viscosity mono-functional or di-functional monomer, a ratio of the weight %) of the lowest viscosity mono-functional or di-functional monomer to the weight % of the highest viscosity mono-functional or di-functional monomer being at least about 2, and the at least one (meth)acrvlate oligomer being in an amount ranging from about 10 wt. % to about 70 wt. %, based on the total weight of the dielectric ink composition;
        a sensitizing photoinitiator;
        an amine synergist photoinitiator; and
        a phosphine oxide photoinitiator.

14. The device of claim 13, wherein the at least one (meth)acrylate compound includes at least one of the (meth)acrylate oligomers and at least two of the (meth)acrylate monomers, the at least two (meth)acrylate monomers comprising a lowest viscosity mono-functional or di-functional monomer and a highest viscosity mono-functional or di-functional monomer.

15. The device of claim 14, wherein the at least one (meth)acrylate oligomer is selected from the group consisting of polyester (meth)acrylate oligomers, polyether (meth)acrylate oligomers, epoxy (meth)acrylate oligomers, and urethane (meth)acrylate oligomers.

16. The device of claim 13, wherein the at least one (meth)acrylate compound comprises at least two different (meth)acrylate monomers, the at least two different (meth)acrylate monomers being selected from the group consisting of monofunctional (meth)acrylates, difunctional (meth)acrylates, trifunctional (meth)acrylates and combinations thereof.

17. The device of claim 13, wherein the sensitizing photoinitiator is a thioxanthone photoinitiator.

18. The device of claim 13, wherein the amine synergist photoinitiator is selected from the group consisting of 2-(4-methylbenzyl)-2-(dimethylamino)-1-(4-morpholinophenyl)butan-1-one, Ethyl Michler's ketone (EMK) and combinations thereof.

19. The device of claim 13, wherein the phosphine oxide photoinitiator is selected from the group consisting of Phenylbis(2,4,6-trimethylbenzoyl)phosphine oxide; Diphenyl-(2,4,6, Trimethylbenzoyl)phosphine oxide (TPO); Ethyl (2,4,6-trimethylbenzoyl)phenylphosphinate (TPO-L) and combinations thereof.

20. The composition of claim 7, wherein the thioxanthone photoinitiator is selected from the group consisting of 2-isopropyl thioxanthone, 2,4-diethylthioxanthone (DETX), 2-chlorothioxanthone (CTX), 2,4-dimethylthioxanthone (RTX) and 1-chloro-4-propoxythioxanthone (CPTX).

* * * * *